United States Patent
Hsieh

(10) Patent No.: US 7,596,233 B2
(45) Date of Patent: Sep. 29, 2009

(54) SYSTEM AND METHOD FOR CONTROLLING VOLUME WITH A SINGLE KNOB

(75) Inventor: Kuan-Hong Hsieh, Tu-chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 874 days.

(21) Appl. No.: 11/060,967

(22) Filed: Feb. 17, 2005

(65) Prior Publication Data

US 2005/0180585 A1    Aug. 18, 2005

(30) Foreign Application Priority Data

Feb. 17, 2004    (TW) .............................. 93103694 A

(51) Int. Cl.
*H03G 3/00* (2006.01)

(52) U.S. Cl. ..................................... 381/109

(58) Field of Classification Search .................. 381/109, 381/119, 120
See application file for complete search history.

(56) References Cited

U.S. PATENT DOCUMENTS 4,349,779 A    9/1982    Ono 5,513,268 A *  4/1996    Bironas et al. .............. 381/109
5,745,057 A *  4/1998    Sasaki et al. ................ 381/109
6,317,502 B1   11/2001   Imai
2002/0031236 A1* 3/2002  Shimizu et al. ............. 381/104

FOREIGN PATENT DOCUMENTS

CN    100399862 C    7/2008

* cited by examiner

*Primary Examiner*—Ping Lee
(74) *Attorney, Agent, or Firm*—Wei Te Chung

(57) ABSTRACT

A system for controlling volume with a single knob includes: a knob (10) for generating rotation signals; a controlling apparatus (11) for determining a rotational direction and speed of each rotation signal, and generating corresponding volume controlling signals for adjusting volume according to the rotation signals; and an audio amplifier (12) for adjusting volume according to the volume controlling signals. The knob includes a rotational operation part (100) and a rotation signal generating circuit (101). The controlling apparatus includes a number of input ports (110), a timer (111), a counter (112), a ROM (Read Only Memory) (113), a RAM (Random Access Memory) (114), a CPU (Central Processing Unit) (115), a PWM (Pulse Width Modulator) (116), and a number of output ports (117). A related method for controlling volume with a single knob is also disclosed.

16 Claims, 3 Drawing Sheets

SYSTEM AND METHOD FOR CONTROLLING VOLUME WITH A SINGLE KNOB

BACKGROUND OF THE INVENTION

1. Field of the Invention

The present invention relates to systems and methods for controlling the volume of an audio output, and particularly to a system and method for controlling volume according to the rotational direction and speed of a single manually operated knob.

2. Background of the Invention

Presently, there are many audio output apparatuses for amplifying audio signals of loudhailers. These audio output apparatuses are known as "audio frequency amplifier apparatus," and are used to adjust the output voltage of the loudhailers according to manual adjustment operations and corresponding adjustment commands. Conventional audio output apparatuses provide a single knob for adjusting volume, and a separate muting key for muting the volume.

One kind of audio output apparatus for digitally adjusting volume comprises a rotation adjustor and a rotation encoder. The rotation adjustor is for manual rotation by a user. The rotation encoder is for outputting information indicating the direction of rotation, and supplying the information together with an output pulse to a microcomputer for generating a volume adjustment signal. The microcomputer determines the direction of the adjustment (i.e., upward or downward) on the basis of the information indicating the direction of the rotation obtained from the rotation encoder, and supplies a unit amount of change in volume per one pulse as a volume adjustment signal. For example, each time one pulse is received from the rotation encoder, the microcomputer determines the rotational speed by measuring the cycle of pulses from the rotation encoder, and alters the unit change in volume per one pulse as a volume adjustment signal. For example, when the rotational speed is high, the unit change in volume is increased corresponding to the rotational operation. Because the alteration to the unit change in volume corresponds linearly with the rotational speed, it is difficult to rapidly make adjustments from a very high volume to a very low volume, and vice-versa. The user ends up having to spend more time in making adjustments.

There is nothing known in the art which can efficiently and rapidly effect large adjustments to volume during high-speed rotation of a single knob of a volume controlling apparatus.

SUMMARY OF THE INVENTION

Accordingly, a main objective of the present invention is to provide a system and method for efficiently and quickly adjusting volume according to a single knob's rotational direction and speed.

To accomplish the above objective, a system for controlling volume with a single knob in accordance with a preferred embodiment of the present invention comprises: a knob for performing of rotational operations by users and generating rotation signals corresponding to the rotational operations, the knob comprising a rotational operation part for performing the rotational operations and a rotation signal generating circuit for generating the rotation signals, each rotation signal including a rotational direction signal and a rotation pulse; a controlling apparatus for determining a rotational direction and speed of the rotational operation part, and generating corresponding volume controlling signals for adjusting volume, the controlling apparatus comprising a plurality of input ports for receiving the rotation signals form the rotation signal generating circuit, a timer for measuring a cycle of each rotation pulse from the rotation signal generating circuit, a counter for counting a number of continuous rotation pulses, a ROM (Read Only Memory) for storing data including a preset reference table, a RAM (Random Access Memory) for storing the cycle of the rotation pulse obtained from the timer and the number of continuous rotation pulses obtained from the counter, a CPU (Central Processing Unit) for comparing the cycle and the number in the RAM with the preset reference table on the ROM and generating corresponding volume controlling signals for adjusting volume, a PWM (Pulse Width Modulator) for generating a signal amplitude according to the volume controlling signal, and a plurality of output ports for outputting the signal amplitude; and an audio amplifier for adjusting volume according to the signal amplitude.

Further, the present invention provides a method for controlling volume using the above-described system, the method comprising the steps of: (a) receiving a rotation signal from the knob; (b) determining whether the audio amplifier is in a mute state; (c) determining a rotational direction according to the rotation signal; (d) comparing a cycle of the rotation pulse and a number of continuous rotation pulses with a preset reference table; (e) resetting the audio amplifier as "un-mute" if the audio amplifier is in a mute state, the rotational direction is clockwise, the cycle is less than a preset time $T_0$, and the number of the continuous rotation pulses is greater than or equal to a preset number; (f) resetting the audio amplifier as mute, if the audio amplifier is in an "un-mute" state, the rotational direction is counterclockwise, the cycle is less than a preset time $T_0$, and the number of continuous rotation pulses is greater than or equal to a preset number; and (g) generating a volume controlling signal for decreasing volume; or (h) generating a volume controlling signal for increasing volume.

In summary, the system and method for controlling volume with a single knob are quick and efficient, without the need for adjusting volume step by step.

Other objects, advantages and novel features of the present invention will be drawn from the following detailed description with reference to the attached drawings, in which:

DETAILED DESCRIPTION OF THE INVENTION

Figure 1:
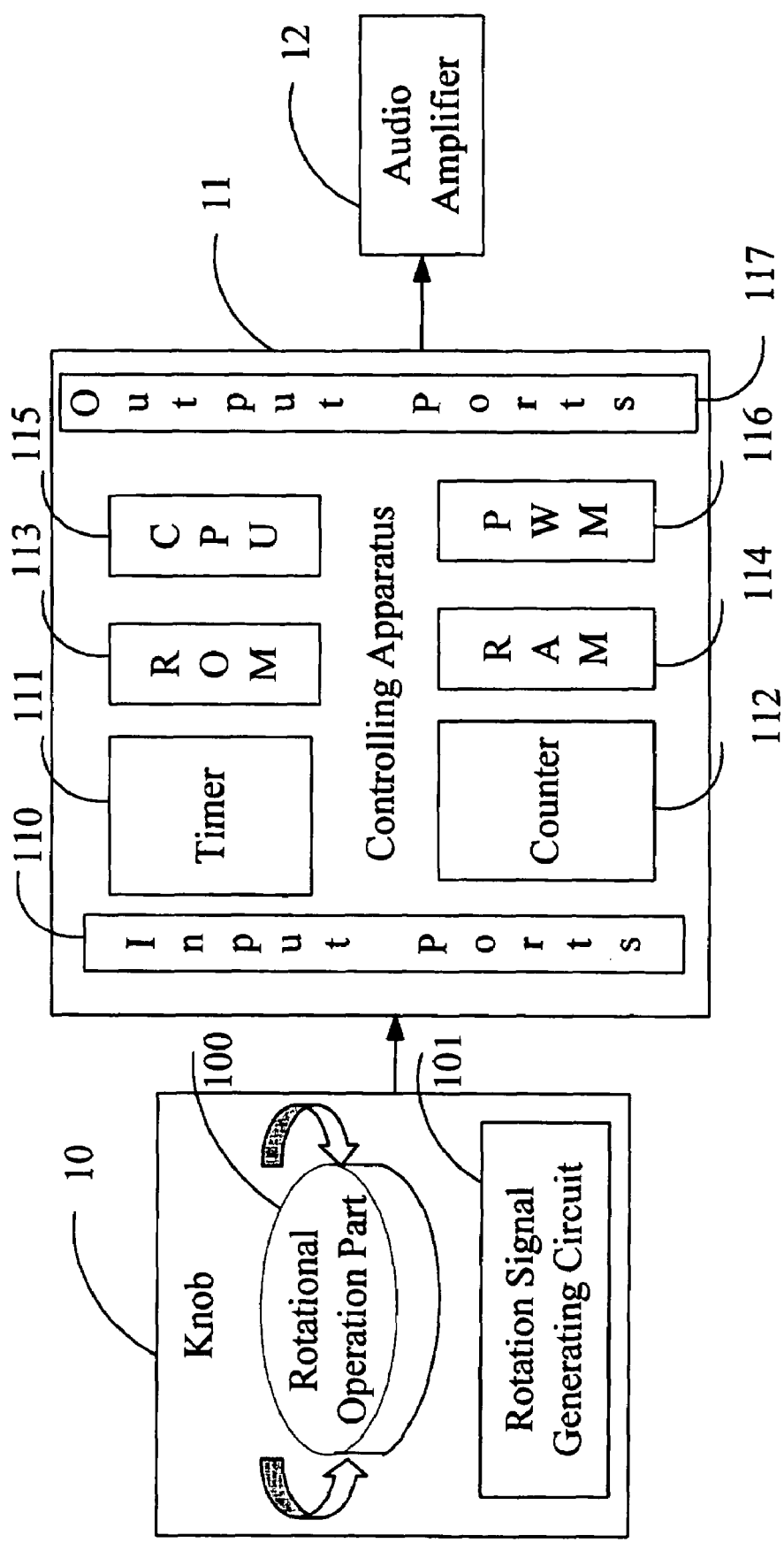
FIG. 1 is a schematic diagram of hardware infrastructure of a system for controlling volume with a single knob in accordance with the preferred embodiment of the present invention.

FIG. 1 is a schematic diagram of hardware infrastructure of a system for controlling volume with a single knob (hereinafter, "the system") in accordance with the preferred embodiment of the present invention. The system comprises a knob 10, a controlling apparatus 11, and an audio amplifier 12. Users perform rotational operations on the knob 10. The knob 10 then generates rotation signals according to the rotational operations, and transmits the rotation signals to the controlling apparatus 11. The knob 10 comprises a rotational operation part 100 and a rotation signal generating circuit 101. The rotational operation part 100 is for users to grasp and perform rotational operations. Each rotational operation may comprise one or more rotations. The rotation signal generating circuit 101 generates rotation signals according to the rotational operations. Each rotation signal corresponds to a rotation, and comprises a rotational direction signal and a corresponding rotation pulse. The controlling apparatus 11 may be a single chip, and comprises a plurality of input ports 110, a timer 111, a counter 112, a ROM 113, a RAM 114, a CPU 115, a PWM 116 and a plurality of output ports 117. The input ports 110 receive rotation signals from the rotation signal generating circuit 101, and can comprise I/O ports. The timer 111 measures a cycle of each rotation pulse. The counter 112 counts a number of rotation pulses generated continuously in the rotation signal generating circuit 101 during each rotational operation. The ROM 113 stores data including a preset reference table. The RAM 114 stores the cycle of each rotation pulse obtained from the timer 111 and the number of continuous rotation pulses obtained from the counter 112. The CPU 115 compares the cycle of each rotation pulse and the number of the continuous rotation pulses in the RAM 114 with the preset reference table stored in the ROM 113, and generates a corresponding volume controlling signal. The preset reference table comprises the following contents: when the cycle of any rotation pulse is less than a preset time $T_0$, the rotational speed is a high speed corresponding to a volume adjustment of 10 percent for each rotational operation; when the cycle of the rotation pulse is between $T_0$ and a preset time $T_n$ (i.e., is greater than or equal to $T_0$, but less than $T_n$), the rotational speed is a medium speed corresponding to a volume adjustment in the range of 2 percent to 9 percent for each rotational operation; and when the cycle of the rotation pulse is not between $T_0$ and $T_n$ (i.e., is greater than or equal to $T_n$), the rotational speed is a low speed corresponding to a volume adjustment of 1 percent for each rotational operation. The PWM 116 generates a signal amplitude according to the volume controlling signal generated by the CPU 15. The output ports 117 output the signal amplitude to the audio amplifier 12. The output ports 117 can comprise I/O ports and/or PWM ports. The audio amplifier 12 adjusts the volume according to the signal amplitude.

Figure 2:
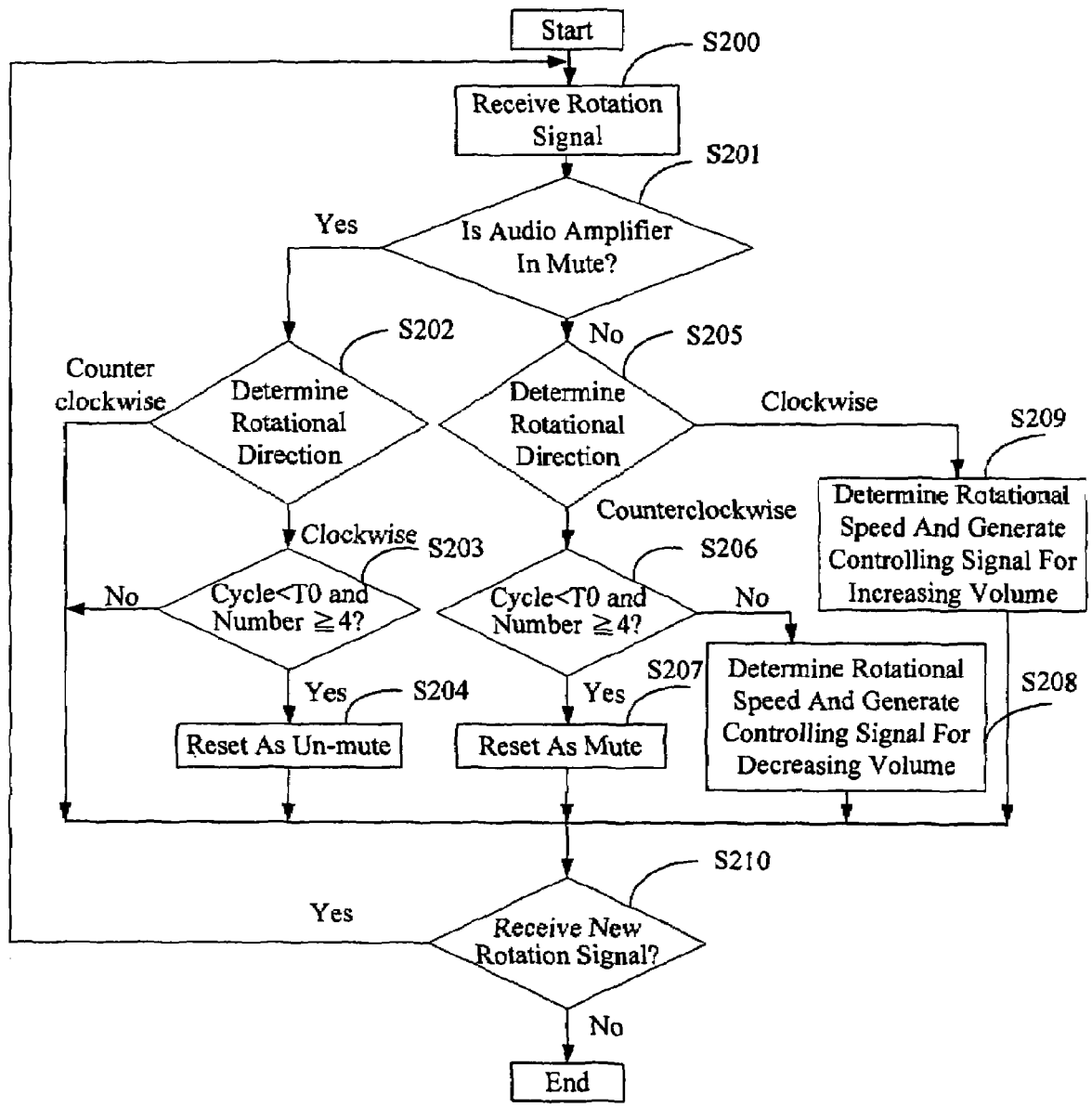
FIG. 2 is a flowchart of a preferred method for controlling volume with a single knob according to the present invention, utilizing the system of FIG. 1.

FIG. 2 is a flowchart of a preferred method for controlling volume with a single knob according to the present invention, utilizing the above-described system. In step S200, the controlling apparatus 11 receives a rotation signal from the rotation signal generating circuit 101. In step S201, the controlling apparatus 11 determines whether the audio amplifier 12 is in a mute state. If the audio amplifier 12 is not in a mute state, the procedure goes to step S205 described below. If the audio amplifier 12 is in a mute state, in step S202, the CPU 115 determines whether the rotational direction of the rotation signal is clockwise or counter clockwise. If the rotational direction is counter clockwise, the procedure goes directly to step S210 described below. If the rotational direction is clockwise, in step S203, the CPU 115 determines whether the cycle of the rotation pulse is less than a preset time $T_0$, and whether the number of continuous rotation pulses during the rotational operation is greater than or equal to 4. If the cycle of the rotation pulse is not less than $T_0$, and/or the number of continuous rotation pulses is less than 4, the procedure goes directly to step S210. If the cycle of the rotation pulse is less than $T_0$ and the number of continuous rotational pulses is greater than or equal to 4, in step S204, the CPU 115 resets the audio amplifier 12 as "un-mute," whereupon the procedure goes to step S210.

In step S205, the CPU 115 determines whether the rotational direction is clockwise or counter clockwise according to the rotation signal. If the rotational direction is clockwise, the procedure goes to step S209 described below. If the rotational direction is counterclockwise, in step S206, the CPU 115 determines whether the cycle of the rotation pulse is less than $T_0$, and whether the number of continuous rotation pulses is greater than or equal to 4. If the cycle of the rotation pulse is not less than $T_0$, and/or the number of continuous rotation pulses is less than 4, the procedure goes to step S208 described below. If the cycle of the rotation pulse is less than $T_0$ and the number of continuous rotation pulses is greater than or equal to 4, in step S207, the CPU 115 resets the audio amplifier 12 as mute, whereupon the procedure goes to step S210. In step S208, the CPU 115 determines a rotational speed according to the rotation signal, and generates a volume controlling signal for decreasing volume, whereupon the procedure goes to step S210. In step S209, the CPU 115 determines a rotational speed, and generates a volume controlling signal for increasing volume, whereupon the procedure goes to step S210.

In step S210, the CPU 115 detects whether any of the input ports 110 receives a new rotation signal. If any of the input ports 110 receives a new rotation signal, the procedure returns to step S200, and the steps described above are repeated. If no input port 110 receives a new rotation signal, the procedure is ended.

Figure 3:
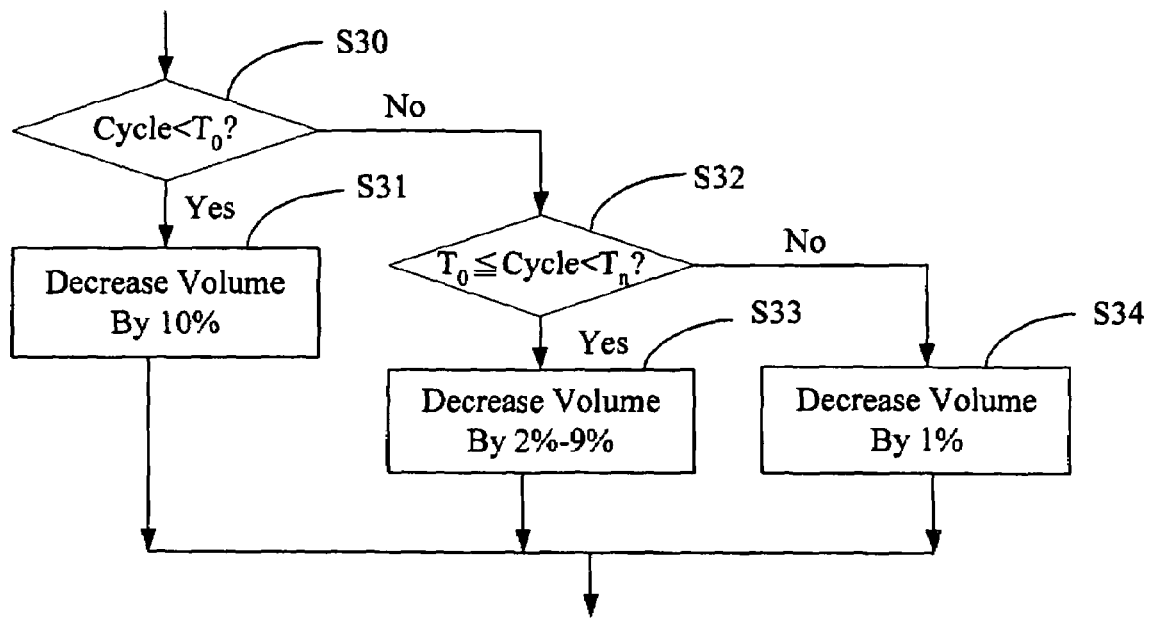
FIG. 3 is a flowchart of implementing one step of FIG. 2, namely generating a volume controlling signal for decreasing volume.

FIG. 3 is a flowchart of implementing step S208 of FIG. 2, namely generating a volume controlling signal for decreasing volume. In step S30, the CPU 115 determines whether the cycle of the rotation pulse is less than the preset time $T_0$. If the cycle of the rotation pulse is less than $T_0$, in step S31, the CPU 115 determines that the rotational speed is a high speed, and generates a volume controlling signal for decreasing volume by 10 percent. The volume controlling signal is transmitted to the PWM 116. The PWM 116 generates a corresponding signal amplitude, and outputs the signal amplitude to the audio amplifier 12 through the output ports 117. If the cycle of the rotation pulse is not less than $T_0$, in step S32, the CPU 115 determines whether the cycle of the rotation pulse is between $T_0$ and a preset time $T_n$ (i.e., is greater than or equal to $T_0$, but less than $T_n$). If the cycle of the rotation pulse is between $T_0$ and $T_n$, in step S33, the CPU 115 determines that the rotational speed is a medium speed, and generates a volume controlling signal for decreasing volume in the range from 2 percent to 9 percent. The PWM 116 generates a corresponding signal amplitude, and outputs the signal amplitude to the audio amplifier 12 through the output ports 117. If the cycle of the rotation pulse is not between $T_0$ and $T_n$ (i.e., is greater than or equal to $T_n$), in step S34, the CPU 115 determines that the rotational speed is a low speed, and generates a volume controlling signal for decreasing volume by 1 percent. The PWM 116 generates a corresponding signal amplitude, and outputs the signal amplitude to the audio amplifier 12 through the output ports 117.

Figure 4:
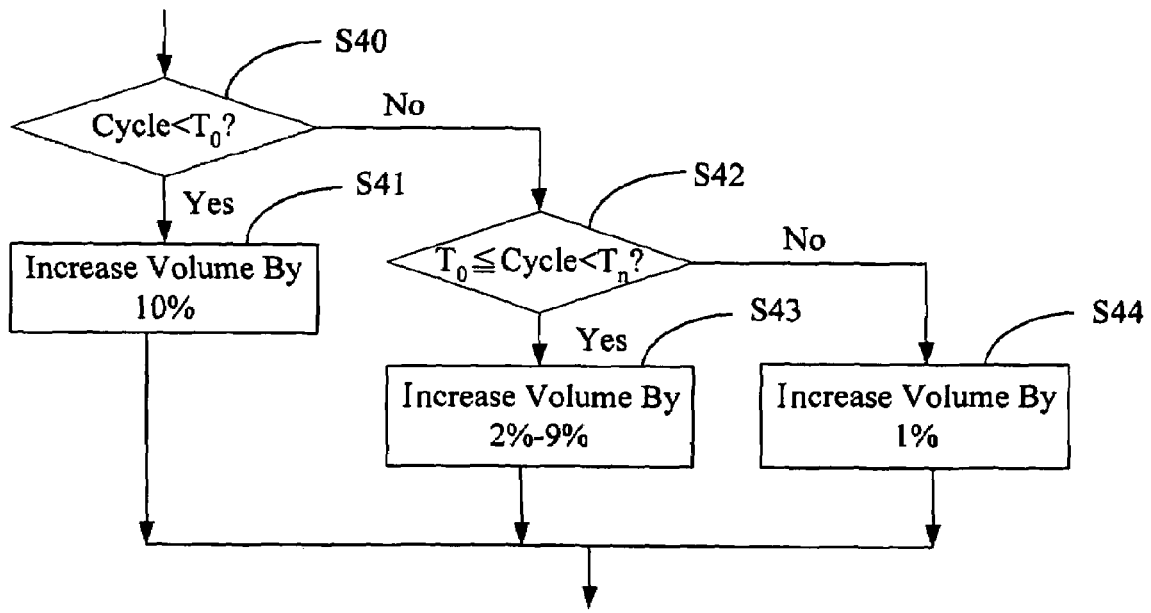
FIG. 4 is a flowchart of implementing another step of FIG. 2, namely generating a volume controlling signal for increasing volume.

FIG. 4 is a flowchart of implementing step S209 of FIG. 2, namely generating a volume controlling signal for increasing volume. In step S40, the CPU 115 determines whether the cycle of the rotation pulse is less than the preset time $T_0$. If the cycle of rotation pulse is less than $T_0$, in step S41, the CPU 115 determines that the rotational speed is a high speed, and generates a volume controlling signal for increasing volume by 10 percent. The volume controlling signal is transmitted to the PWM 116. The PWM 116 generates a corresponding signal amplitude, and outputs the signal amplitude to the audio amplifier 12 through the output ports 117. If the cycle of the rotation pulse is not less than $T_0$, in step S42, the CPU 115 determines whether the cycle of the rotation pulse is between $T_0$ and a preset time $T_n$ (i.e., is greater than or equal to $T_0$, but less than $T_n$). If the cycle of the rotation pulse is between $T_0$ and $T_n$, in step S43, the CPU 115 determines that the rotational speed is a medium speed, and generates a volume controlling signal for increasing volume in the range from 2 percent to 9 percent. The PWM 116 generates a corresponding signal amplitude, and outputs the signal amplitude to the audio amplifier 12 through the output ports 117. If the cycle of the rotation pulse is not between $T_0$ and $T_n$ (i.e., is greater than or equal to $T_n$), in step S44, the CPU 115 determines that the rotational speed is a low speed, and generates a volume controlling signal for increasing volume by 1 percent. The PWM 116 generates a corresponding signal amplitude, and outputs the signal amplitude to the audio amplifier 12 through the output ports 117.

In summary, the system and method for controlling volume with a single knob are quick and efficient, without the need for adjusting volume step by step.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for controlling volume, the system comprising:
   a rotational operation apparatus configured for performing rotational operations by users and generating rotation signals corresponding to the rotational operations, each rotation signal comprising a rotational direction signal and a corresponding rotation pulse;
   a controlling apparatus configured for generating volume controlling signals for adjusting volume; and
   an audio amplifier configured for adjusting volume according to a signal amplitude corresponding to the volume controlling signal;
   wherein the controlling apparatus is further configured for determining a rotational direction, a number of rotation pulses and a cycle of each rotation pulse; and resetting the audio amplifier as mute, if the cycle of rotation pulse is less than a preset time and the number of rotation pluses is greater than or equal to a preset number, the rotational direction is counterclockwise, and the audio amplifier is not in a mute state.

2. The system according to claim 1, wherein said rotation operation apparatus is a knob comprising:
   a rotational operation part for the performing of the rotational operations by the users; and
   a rotation signal generating circuit for generating the rotation signals according to the rotational operations, each of the rotation signals including a rotational direction signal and a rotation pulse;
   the controlling apparatus comprising:
   a plurality of input ports for receiving the rotation signals from the rotation signal generating circuit;
   a timer for measuring a cycle of each rotation pulse;
   a counter for counting a number of rotation pulses generated continuously in the rotation signal generating circuit during each rotational operation;
   a Read Only Memory (ROM) for storing data including a preset reference table;
   a (Random Access Memory (RAM) for storing the cycle of each rotation pulse obtained from the timer and the number of the continuous rotation pulses obtained from the counter;
   a Central Processing Unit (CPU) for comparing the cycle and the number in the RAM with the preset reference table stored in the ROM, and generating a corresponding volume controlling signal for each rotational operation;
   a Pulse Width Modulator (PWM) for generating a signal amplitude according to the volume controlling signal; and
   an output port for outputting the signal amplitude; and
   an audio amplifier for adjusting volume according to the signal amplitude.

3. The system according to claim 2, wherein the controlling apparatus is a single chip.

4. The system according to claim 2, wherein the input ports comprise (Input/Output) I/O ports.

5. The system according to claim 2, wherein the output port is an I/O port.

6. The system according to claim 2, wherein the output port is a PWM port.

7. The system according to claim 2, wherein the preset reference table comprises the following contents: when the cycle of any rotation pulse is less than a preset time T0, a rotational speed is a high speed corresponding to a high volume adjustment for each rotational operation; when the cycle of the rotation pulse is between T0 and a preset time Tn, the rotational speed is a medium speed corresponding a medium volume adjustment for each rotational operation; and when the cycle of the rotation pulse is greater than or equal to Tn, the rotational speed is a low speed corresponding to a low volume adjustment for each rotational operation.

8. The system according to claim 7, wherein the high volume adjustment is approximately 10 percent for each rotational operation, the medium volume adjustment is in the range from approximately 2 percent to approximately 9 percent for each rotational operation, and the low volume adjustment is approximately 1 percent for each rotational operation.

9. A method for controlling volume with a single knob, comprising the steps of:
   providing a knob for generating rotation signals during rotational operations, each of the rotation signals comprising a rotational direction signal and a rotation pulse;
   providing a controlling apparatus receiving the rotation signals from the knob;
   providing an audio amplifier;
   determining whether the audio amplifier is in a mute state;
   determining the rotational direction according to the rotation signal;
   generating a volume controlling signal for increasing volume, if the rotational direction is clockwise and the audio amplifier is not in a mute state;
   determining whether a cycle of each rotation pulse is less than a preset time and whether a number of continuous rotation pulses during a rotation operation is greater than or equal to a preset number;
   generating a volume controlling signal for decreasing volume, if the cycle is greater than the preset time or the number is less than the preset number, the rotational direction is counterclockwise, and the audio amplifier is not in a mute state; and
   resetting the audio amplifier as mute, if the cycle of rotation pulse is less than a preset time and the number of the rotation pulses is greater than or equal to a preset number, the rotational direction is counterclockwise, and the audio amplifier is not in a mute state.

10. The method according to claim 9, further comprising the step of:
    resetting the audio amplifier as un-mute, if the cycle is less than the preset time and the number of rotation pluses is greater than or equal to the preset number, the rotational direction is clockwise, and the audio amplifier is in a mute state.

11. The method according to claim 9, wherein the step of generating a volume controlling signal for decreasing volume comprises the steps of:

generating a volume controlling signal for decreasing volume by approximately 10percent if the cycle of the rotation pulse is less than a preset time T0;

generating a volume controlling signal for decreasing volume by between approximately 2 percent and approximately 9percent if the cycle of the rotation pulse is between T0 and a preset time Tn; or generating a volume controlling signal for decreasing volume by approximately 1percent if the cycle of the rotation pulse is greater than or equal to Tn.

12. The method according to claim 9, wherein the step of generating a volume controlling signal for increasing volume comprises the steps of:

generating a volume controlling signal for increasing volume by approximately 10percent if the cycle of the rotation pulse is less than a preset time T0;

generating a volume controlling signal for increasing volume by between approximately 2 percent and approximately 9 percent if the cycle of the rotation pulse is between T0 and a preset time Tn; or generating a volume controlling signal for increasing volume by approximately 1percent if the cycle of the rotation pulse is greater than or equal to Tn.

13. A method for controlling volume with a rotatable single knob, comprising steps of:

providing a knob and an audio amplifier;

creating a rotation direction and a rotation pulse via rotation of the knob; muting the audio amplifier if the audio amplifier is originally un-muted and the knob is rotated to intentionally lower volume under a condition that the corresponding rotation pulse defines a cycle of the rotation pulse being smaller than a first predetermined value and a number of the rotation pulses being larger than a second predetermined value;

otherwise un-muting the audio amplifier if the audio amplifier is originally muted and the knob is rotated to the intentionally raise volume under a condition that the corresponding rotation pulse defines another cycle of the rotation pulse being smaller than a third predetermined value and another number of the rotation pulse being larger than said a fourth predetermined value.

14. The method of claim 13, wherein said first predetermined value is equal to the third predetermined value.

15. The method of claim 13, wherein said second predetermined value is equal to the fourth predetermined value.

16. The system according to claim 1, wherein the controlling apparatus is further configured for resetting the audio amplifier as un-mute, if the cycle is less than the preset time and the number is greater than or equal to the preset number, the rotational direction is clockwise, and the audio amplifier is in a mute state.

* * * * *

UNITED STATES PATENT AND TRADEMARK OFFICE
CERTIFICATE OF CORRECTION

PATENT NO.       : 7,596,233 B2                                         Page 1 of 1
APPLICATION NO. : 11/060967
DATED            : September 29, 2009
INVENTOR(S)      : Kuan-Hong Hsieh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1161 days.

Signed and Sealed this

Twenty-eighth Day of September, 2010

David J. Kappos
*Director of the United States Patent and Trademark Office*